United States Patent
Joe

(10) Patent No.: US 6,633,203 B1
(45) Date of Patent: *Oct. 14, 2003

(54) METHOD AND APPARATUS FOR A GATED OSCILLATOR IN DIGITAL CIRCUITS

(75) Inventor: Jurianto Joe, Singapore Science Park II (SG)

(73) Assignee: The National University of Singapore, Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 09/558,082

(22) Filed: Apr. 25, 2000

(51) Int. Cl.⁷ .................................................. H03B 5/08

(52) U.S. Cl. .................... 331/173; 331/111; 331/74; 331/36 L; 331/172

(58) Field of Search ............................ 331/111, 74, 173, 331/36 L, 172

(56) References Cited

U.S. PATENT DOCUMENTS

| | | | |
|---|---|---|---|
| 3,209,282 A | 9/1965 | Schnitzler | |
| 3,239,832 A | 3/1966 | Renard | |
| 3,246,256 A | 4/1966 | Sommers, Jr. | |
| 3,303,350 A | 2/1967 | Neff et al. | |
| 3,312,911 A | 4/1967 | De Boer | 331/49 |
| 3,387,298 A | 6/1968 | Kruy et al. | |
| 3,527,949 A | 9/1970 | Hoth et al. | |
| 3,571,753 A | 3/1971 | Saunders | |
| 3,755,696 A | 8/1973 | Nicholson et al. | |
| 3,761,621 A | 9/1973 | Vollmeyer et al. | |
| 3,846,717 A | 11/1974 | Fleming | |
| 3,967,210 A | 6/1976 | Aumann | 331/56 |
| 4,028,562 A | 6/1977 | Zuleeg | 327/566 |
| 4,037,252 A | 7/1977 | Janssen | |
| 4,365,212 A | 12/1982 | Gentile et al. | 331/111 |
| 4,425,647 A | 1/1984 | Collins et al. | |
| 4,459,591 A | 7/1984 | Haubner et al. | |
| 4,560,949 A | 12/1985 | Young | |
| 4,599,549 A | 7/1986 | Mutoh et al. | |
| 4,641,317 A | 2/1987 | Fullerton | |
| 4,743,906 A | 5/1988 | Fullerton | |
| 4,862,160 A | 8/1989 | Ekchian et al. | |
| 5,012,244 A | 4/1991 | Wellard et al. | |
| 5,107,264 A | 4/1992 | Novof | 341/101 |
| 5,170,274 A | 12/1992 | Kuwata et al. | |
| 5,274,375 A | 12/1993 | Thompson | |
| 5,337,054 A | 8/1994 | Ross et al. | |
| 5,339,053 A | 8/1994 | Lux et al. | 331/99 |
| 5,459,749 A | 10/1995 | Park | |

(List continued on next page.)

FOREIGN PATENT DOCUMENTS

| | | |
|---|---|---|
| DD | 94 855 | 1/1973 |
| DE | 2459531 A1 | 7/1976 |
| DE | 2602794 A1 | 7/1977 |
| DE | 19809334 A1 | 9/1999 |
| GB | 1036328 | 7/1966 |
| JP | 11074766 | 3/1999 |
| WO | WO 00/05597 | 2/2000 |

OTHER PUBLICATIONS

Patarasen, S. et al., Maximum–Likelihood Symbol Synchronization and Detection of OPPM Sequeunces, IEEE Transactions on Communications, New York, US, Jun. 1994, pps. 9, vol. 42, No. 6.

Sen et al., Integration of GaAs/A1As Resonant Tunneling Diodes for Digital and Analog Applications with Reduced Circuit Complexity, Oct. 13–16, 1987.

(List continued on next page.)

*Primary Examiner*—Arnold Kinkead
(74) *Attorney, Agent, or Firm*—Townsend and Townsend and Crew LLP; Kenneth R. Allen

(57) ABSTRACT

A gated oscillator is provided for digital circuits. The gated oscillator is achieved by the unconventional use of controlling the operating point of a Van der Pol oscillator. Oscillations are achieved by Van der Pol self-oscillation behavior. The result is a highly simplified gated oscillator circuit for many digital circuit applications

20 Claims, 4 Drawing Sheets

U.S. PATENT DOCUMENTS

| | | | |
|---|---|---|---|
| 5,532,641 | A | 7/1996 | Balasubramanian et al. |
| 5,610,907 | A | 3/1997 | Barrett |
| 5,691,723 | A | 11/1997 | King et al. |
| 5,757,301 | A | 5/1998 | Kuo et al. |
| 5,764,702 | A | 6/1998 | Caiaffa |
| 5,777,507 | A | 7/1998 | Kaminishi et al. |
| 5,789,992 | A | 8/1998 | Moon |
| 5,812,081 | A | 9/1998 | Fullerton |
| 5,832,035 | A | 11/1998 | Fullerton |
| 5,892,701 | A | 4/1999 | Huang et al. |
| 5,901,172 | A | 5/1999 | Fontana et al. |
| 6,023,672 | A | 2/2000 | Ozawa |
| 6,044,113 | A | 3/2000 | Oltean |
| 6,060,932 | A | 5/2000 | Devin |
| 6,087,904 | A | 7/2000 | Wen |
| 6,259,390 | B1 * | 7/2001 | Joe .......................... 341/133 |
| 6,275,544 | B1 | 8/2001 | Aiello et al. |
| 6,292,067 | B1 | 9/2001 | Sasabata et al. |

OTHER PUBLICATIONS

Gang Li et al., "Performance of a Ratio–Threshold Diversity Combining Scheme in FFH/FSK Spread Spectrum Systems in Partial Band Noise Interference," Department of Electrical and Computer Engineering, and Communication Research Centre, IEEE 1992, pps. 0672–0676.

Gang Li et al., "Maximum–Likelihood Diversity Combining in Partial–Band Noise Interference Channel," Department of Electrical and Computer Engineering, and Communication Research Centre, IEEE 1993, pps. 507–511.

Abel, E., "Gated Oscillator Emulates a Flip–Flop", EDN Access, pps. 1–2, Mar. 16, 1995.

Gallerani, A., "Oscillator Meets Three Requirements", EDN Access, pps. 119–120, Dec. 3, 1998.

L. Goras et al., "On Linear Inductance– and Capacitance–Time Conversions Using NIC–Type Configuration," *IEEE Transactions on Industrial Electronics*, vol. 40, No. 5, pp. 529–531 (Oct. 1993).

V.H. Jakubaschk, "Das Große Elektronikbastelbuch," *Deutscher Militärverlag, Leipzig*, pp. 206–209 (1968).

J.P. Keener, "Analog Circuitry for the van der Pol and FitzHugh–Nagumo Equations," *IEEE*, pp. 1011–1015 (1983).

U. Tietze et al., "Halbleiter–Schaltungstechnik, Fünfte, überarbeitete Auflage," *Springer–Verlag, Berlin Heidelberg*, New York, pp. 255–258 (1980).

D. Wang et al., "Image Segmentation Based on Oscillatory Correlation," *Neural Computation*, vol. 9, pp. 805–836 (1997).

English Translation of Jakubaschk, "das Grosse Elektronikbastelbuch," Deutscher Militärverlag, Leipzig, pp. 206–209 (1968), entitled *10.5.1 Low–Power Tunnel Diode Remote Control Transmitter* (1968), 3 pages total.

English Translation of TIETZE, "Halbleiter–Schaltungstechnik, Fünfte, öberarbeitete Auflage," Springer–Verlag, Berlin Heidelberg, New York, pp. 255–258 (1980), entitled Semiconductor Circuit Techniques (1980), total of 5 pages.

Goras et al., "On Linear Inductance–and Capacitance–Time Conversions Using NIC–Type Configuration," *IEEE Transactions on Industrial Electonics* ,40(5):529–531 (1993).

Jakubaschk, "das Grosse Elektronikbastelbuch," Deutscher Militärverlag, Leipzig, pp. 206–209 (1968).

Keener, *Analog Circuitry for the van der Pol and FitzHugh– Nagumo Equations,* IEEE 1983, pp. 1011–1015.

Tietze et al., "Halbleiter–Schaltungstechnik, Fünfte, Öberarbeitete Auflage," Springer–Verlag, Berlin Heidelberg, New York, pp. 255–258 (1980).

Wang et al., "Image Segmentation Based on Oscillatory Correlation," *Neural Computation,* 9:805–836 (1997).

\* cited by examiner

METHOD AND APPARATUS FOR A GATED OSCILLATOR IN DIGITAL CIRCUITS

BACKGROUND OF THE INVENTION

The present invention relates to oscillators and more particularly to gated oscillators.

Oscillators have a wide range of uses. For example, microprocessor operation is synchronized by the periodic timing signals provided by an oscillator. Digital tachometers and digital speedometers in an automobile require a precision reference to provide accurate read-outs. Medical devices such as pacemakers require an accurate pulse generator to ensure proper rhythmic stimulation of the heart.

A gated oscillator is an oscillator that starts or stops oscillating by an enabling signal. In a conventional gated oscillator, such as the one disclosed in U.S. Pat. No. 4,365,212, oscillations are produced by periodically charging and discharging a capacitor between first and second voltage levels when the oscillator is enabled. If it is disabled, the oscillations are stopped by preventing the capacitor from periodically charging and discharging.

Let the first voltage level be lower than the second voltage level. If there is no extra circuitry associated with the capacitor, then the capacitor will continue to discharge past the first voltage level toward the lower power supply voltage when the oscillation is stopped. When the oscillator is enabled, a certain amount of time is needed to charge the capacitor from lower power supply voltage to the first voltage level and then to the second voltage level, whereupon oscillatory behavior ensues. The delay in charging the capacitor from the lower power supply voltage to the first voltage level causes the first pulse in the pulse train to be wider than the rest of the pulses. This error is undesirable in applications which require and expect predictable pulse widths. The error can be substantially corrected if extra circuitry is added to prevent the capacitor from discharging past the first voltage level. This, of course, increases the complexity of the gated oscillator circuitry.

Gated oscillators have many applications in digital circuits. In an article entitled "Gated oscillator emulates a flip-flop," published in the Mar. 16, 1995 issue of EDN Magazine, a gated oscillator circuit is described in a flip-flop configuration. In another article entitled "Oscillator meets three requirements," published in the Dec. 3, 1998 issue of EDN Magazine, a gated oscillator is described for use in clock circuit as the clocking source in a digital application.

A design that can be used as a gated oscillator is disclosed in U.S. Pat. No. 5,339,053. A shortcoming of this design, however, is that the enable signal and the gated oscillation are mixed at the circuit's output. Additional external circuitry is therefore required to separate the two signals.

A simplistic gated oscillator circuit can be built using an AND logic gate. An enable signal is applied to one of its terminals and a continuous free running oscillator is applied to the other terminal. The output produces the desired gated oscillations. This prior art gated oscillator requires an external continuous free running oscillator. A problem with this design is the inability of the enable signal to synchronize with the free running oscillator, thus producing indeterminate behavior. Another problem is that the free running oscillation fixes the frequency and duty cycle of the gated oscillator output. Yet another is that the free running oscillator is continually running, even when the enable signal is removed. Consequently, there is unnecessary consumption of power.

There is a need, therefore, for digital circuit design using a gated oscillator circuit which requires reduced support circuitry. It is desirable to provide a design which is energy efficient. There is a need for a design which can provide a tunable oscillation frequency. There is a further for a design that can provide a tunable duty cycle of the oscillation. It is also desirable that the design has an ability to synchronize the onset of oscillatory behavior with the enable signal.

SUMMARY OF THE INVENTION

A method for generating pulses in a digital circuit includes providing a circuit having a variable operating point. The circuit is defined by a transfer function characterized by having an unstable operating region bounded by a first stable operating region and a second stable operating region. The circuit produces oscillatory output when its operating point is moved into the unstable region. The circuit produces a non-oscillatory output when its operating point is placed into either of the first and second stable regions. The method further includes forcing the operating point into the unstable region to produce oscillatory output. The method further includes forcing the operating point into one of the stable regions in order to terminate oscillations.

A gated oscillator circuit in accordance with the invention includes a circuit having a transfer function defined by an unstable operating region bounded by a first stable operating region and by a second stable operating region. The transfer function defines a set of operating points. The circuit is adapted to produce oscillatory output when the operating point is positioned in the unstable region. The circuit is further adapted to produce a non-oscillatory output when its operating point is positioned in either of the first and second stable regions. A function generator, which selectively produces an output of a first level and an output of a second level is coupled to the circuit as an input signal. The operating point is forced into the unstable region when the function generator output is at the first level. This level is called an enable signal. The operating point is forced into one of the stable regions when the function generator output is at its second output level. This level is referred to as a disable signal.

Consequently, the invention requires only the application of an enable signal to enable oscillations or a disable signal to terminate oscillations. The inventive circuit is advantageous in that its oscillations start and stop substantially instantaneously. There are no transients between the ON and OFF state of the oscillator. Another advantage is that the period of the first cycle of oscillation during an ON period is the same as the subsequent cycles in that ON period. There is no need for additional supporting circuit elements or special circuits for maintaining standby levels in the capacitor. The circuit does not require any external free running oscillation. The circuit will generate its own oscillation when triggered by the enable signal. The circuit is inherently synchronized with the enable signal. By tuning the circuit parameter, without changing the circuit configuration, the duty cycle and the frequency of oscillation can be varied. The gated oscillation at the output of the circuit is not overlapping with the enable signal and therefore no additional circuit is required to separate them.

DESCRIPTION OF THE SPECIFIC EMBODIMENTS

Figure 1A:
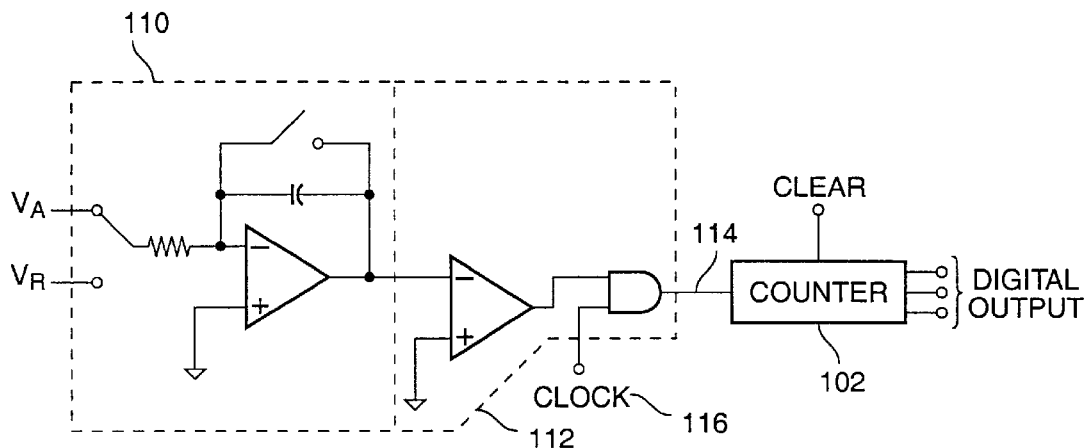
FIG. 1A shows a first embodiment of the invention.

Referring to FIG. 1A, a typical digital circuit such as the illustrated dual slope analog-to-digital converter is shown. $V_R$ is a referenced voltage and $V_A$ is an analog voltage to be converted to a digital representation. The output of integrator 110 is an analog waveform that contains information of the amplitude of $V_A$ with respect to $V_R$. A comparator that converts this analog waveform to an enable signal and AND gate combination 112 that receives an external clocking signal together produce a gated oscillation output 114 which drives the counter.

Figure 1B:
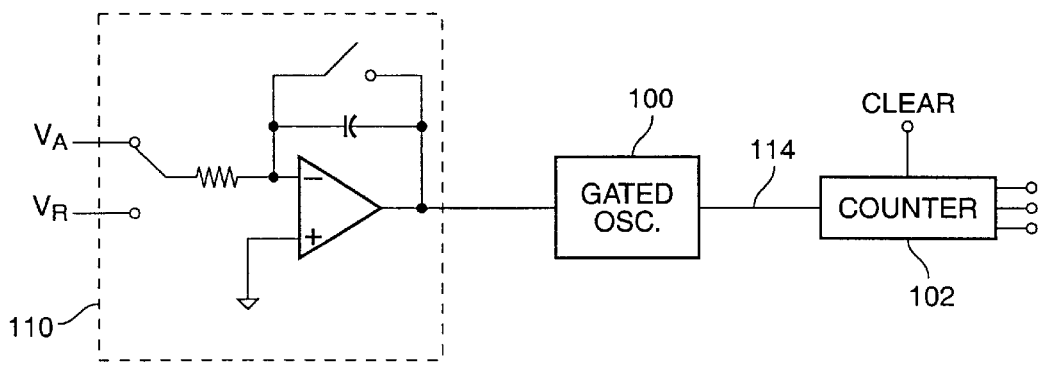
FIG. 1B shows a second embodiment of the invention.
Figure 1C:
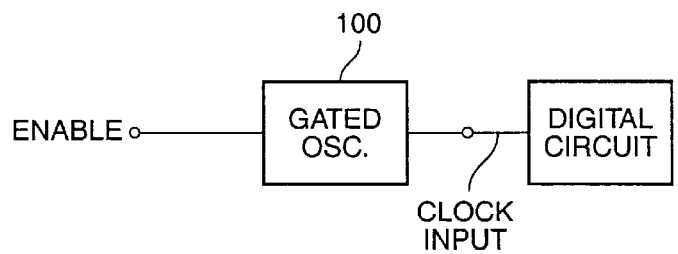
FIG. 1C shows a third embodiment of the invention.

FIG. 1B shows how a gated oscillator 100 in accordance with the present invention can be used to replace the conventional gated clock generation circuit 112 of conventional digital circuits. As shown in FIG. 1C, generally, the clock input of most conventional digital circuits can be driven by the gated oscillator circuit of the present invention. The discussion which follows will focus on the inventive oscillator. It is understood that digital circuits encompass a wide range of applications. The invention is therefore not limited to any one particular digital circuit. Rather, the invention relates to digital circuits having a clock/oscillation generation function provided by the circuit disclosed hereinbelow.

Figure 2:
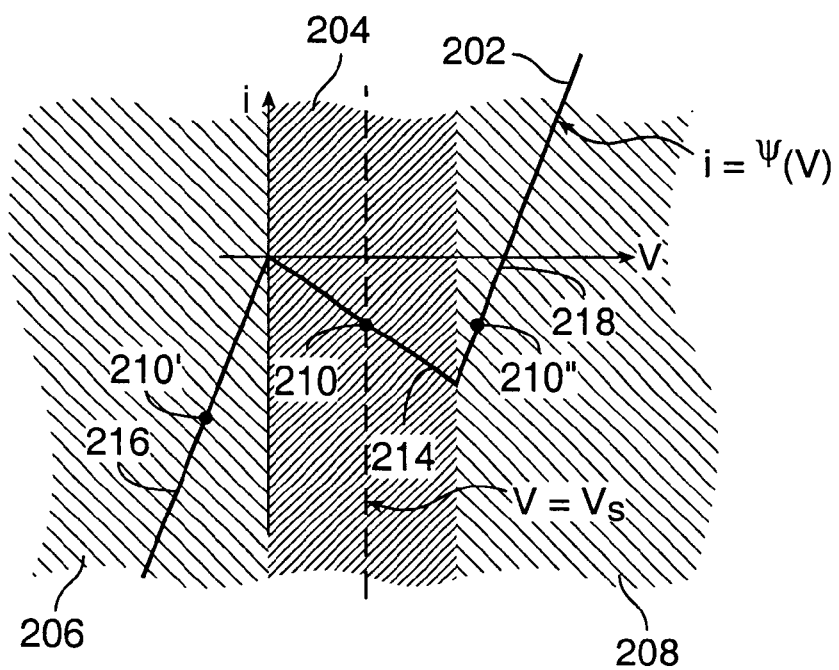
FIG. 2 illustrates generally the transfer function of a circuit used in FIGS. 1b and 1c.

Referring to FIG. 2, gated oscillator circuits in accordance with the present invention exhibit a transfer function whose curve has a generally N-shaped appearance. For the purposes of the present invention, the "transfer function" of a circuit refers to the relationship between any two state variables of that circuit. For example, electronic circuits are typically characterized by their I-V curves, the two state variables being current (I) and voltage (V). Such curves indicate how one state variable (e.g., current, I) changes as the other state variable (voltage, V) varies. As can be seen in FIG. 2, a transfer function curve 202 includes a portion which lies within a region 204, referred to herein as an "unstable" region. The unstable region is bounded on either side by regions 206 and 208, each of which is herein referred to as the "stable" region. As can be seen in FIG. 2, portions of the transfer function curve 202 also lie in the stable regions.

A circuit in accordance with the invention has an associated "operating point" which is defined as its location on the transfer function 202. FIG. 2 shows three operating point positions, 210, 210', and 210". The nature of the output of the circuit depends on the location of the operating point along the transfer function. If the operating point is positioned along the portion 214 of the transfer function that lies within region 204, the output of the circuit will exhibit an oscillatory behavior. Hence, the region 204 in which this portion of the transfer function is found is referred to as an unstable region. If the operating point is positioned along the portions 216, 218 of the transfer function that lie within either of regions 206 and 208, the output of the circuit will exhibit a generally time-varying but otherwise non-oscillatory behavior. For this reason, regions 206 and 208 are referred to as stable regions.

Figure 3:
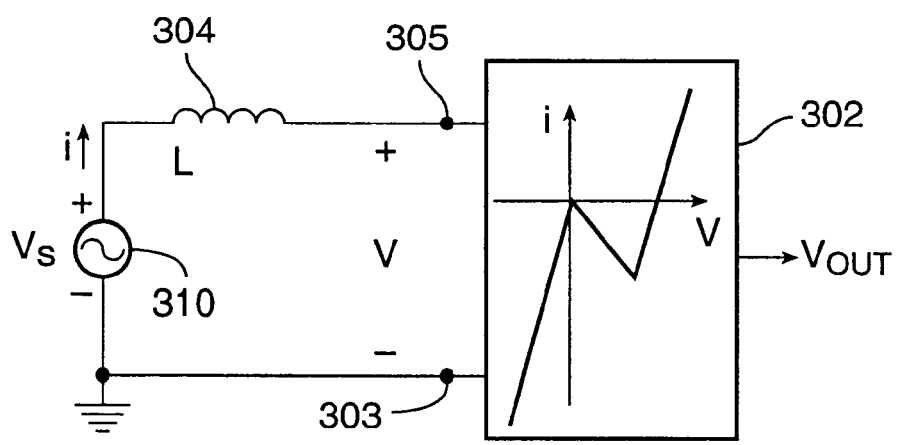
FIG. 3 illustrates schematically a circuit arrangement for forcing the operating point between stable and unstable regions.

Referring to FIGS. 2 and 3, a general configuration for varying the operating point of a circuit is shown. The figure shows a circuit 302 having an input defined by terminals 303 and 305. An inductive element 304 is coupled to terminal 305. A function generator 310 is coupled between the other end of inductive element 304 and terminal 303 of circuit 302, thus completing the circuit. In accordance with the invention, circuit 302 has a transfer function which appears N-shaped. Further in accordance with the invention, circuit 302 is characterized in that its operating point can moved into and out of the unstable region 204 depending on the level of the output $V_s$ of function generator 310. This action controls the onset of oscillatory behavior, and cessation of such oscillatory behavior, at the output $V_{out}$ of circuit 302. Forcing the operation point to be on a portion of the transfer function that lies in the unstable region 204 will result in oscillatory behavior. Forcing the operating point to lie on the transfer function found in one of the stable regions 206, 208 will result in non-oscillatory behavior.

Figure 4:
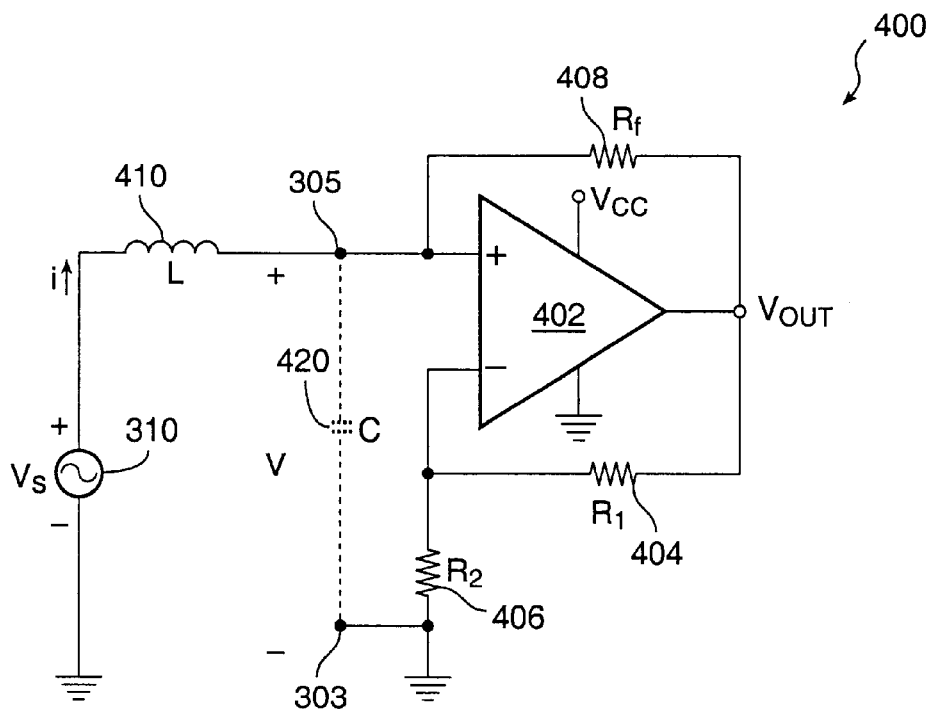
FIG. 4 is an example of a circuit configuration in accordance with the invention.

An example of a circuit that exhibits the N-shaped transfer function is an operation amplifier (op-amp) configured with a feedback resistor between the op-amp output and its non-inverting input. FIG. 4 shows such a circuit 400. An op-amp 402 includes a positive feedback path wherein the op-amp's output $V_{out}$ feeds back to its non-inverting input via feedback resistor 408 having a resistance $R_f$. A portion of the output voltage of op-amp 402 is provided to its inverting input. FIG. 4 shows a voltage dividing circuit comprising resistors 404 and 406, having respectively resistances $R_1$ and $R_2$, to supply a portion of the op-amp output back to its inverting input. Completing the circuit is an inductor 410 and function generator 310 coupled in series between the non-inverting input of op-amp 402 and ground. A typical off-the-shelf op-amp can be used, such as the commonly available LM-358 op-amp.

Figure 5:
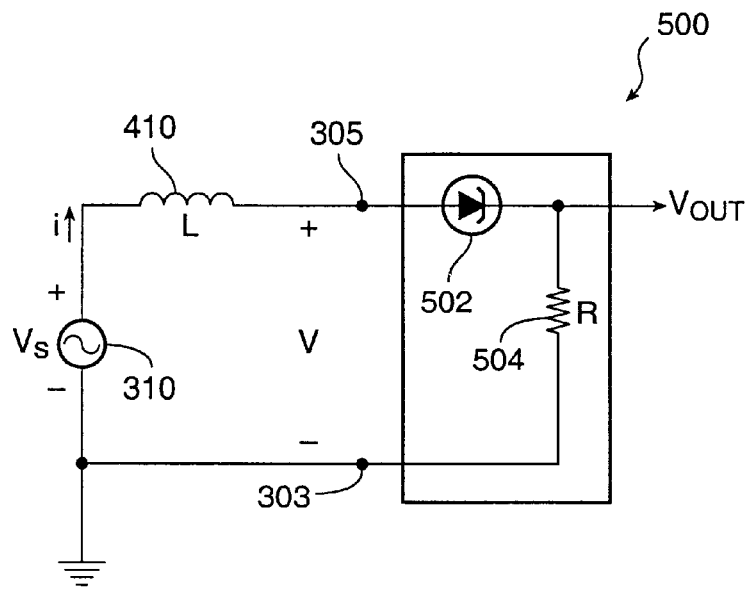
FIG. 5 is another example of a circuit configuration in accordance with the invention.

Another example of a circuit having an N-shaped transfer function is shown in FIG. 5. Here, circuit 500 comprises a tunnel diode 502 coupled to function generator 310 through inductive element 410. The output $V_{out}$ is taken across resistor 504, which is coupled between the other end of diode 502 and ground.

The foregoing circuits can be expressed by the following generalized pair of coupled equations which describe a two-variable Van der Pol (VdP) oscillator:

$$L\frac{dy}{dt} = f(t) - x \quad (1)$$

$$\varepsilon\frac{dx}{dt} = y - \Psi(x) \quad (2)$$

where x and y are the state variables of the VdP oscillator,
L and $\varepsilon$ are parameters of the VdP oscillator,
f(t) is a time varying forcing function that is controllable and can be used to move the operating point of the VdP oscillator, and
$\Psi(x)$ is a cubic function of variable x. $\Psi(x)$ is the key for establishing a controllable VdP oscillator.

Equations (1) and (2) relate to the circuit of FIG. 4 by replacing variables x and y respectively with V and i to represent physical variables that are commonly used in a circuit design. Hence, $$L\frac{di}{dt} = V_s - V \quad (3)$$

$$\lim_{C \to 0} C\frac{dV}{dt} = i - \Psi(V) \quad (4)$$

Parameter C in Eq. (4) represents a small parasitic capacitor 420 across the voltage V, shown in FIG. 4 by phantom lines. $V_s$ is the time varying voltage source of function generator 310 which acts as forcing function. The operating point of circuit 400 is obtained by setting $$\frac{dV}{dt} = 0$$

and $$\frac{di}{dt} = 0.$$

Equations (3) and (4) become $V=V_s$ and $i=\Psi(V)$, respectively. $i=\Psi(V)$ is the transfer function of the op amp with $R_f$, $R_1$ and $R_2$ combinations. Thus, with reference back to FIG. 2, it can be seen that transfer function curve 202 is defined by $i=\Psi(V)$.

The intersection between the line $V=V_s$ and the curve $i=\Psi(V)$ defines the operating point 210 of the circuit. A closer inspection of transfer function 202 defined by $i=\Psi(V)$ reveals that segments 216, 218 have positive slope (di/dV>0) and segment 214 has a negative slope (di/dV<0). When op-amp 402 (FIG. 4) is saturated, operating point 210 lies along one of the two positive sloped segments 216, 218. When op-amp 402 is operating linearly, the operating point lies along the negative sloped segment. When the operating point is on the negative sloped segment 214, oscillatory behavior will be observed at the output $V_{out}$ of circuit 400. Hence the negative sloped segment is said to lie in unstable region 204 as is operating point 210. When the operating point 210', 210" is on a positive sloped segment, a non-oscillatory output is observed. Hence the positive segments are said to lie in stable regions 206, 208.

The operating point 210 can be moved along the transfer function by changing the output $V_s$ of function generator 310 as it is applied to the input of circuit 400. In particular, the operating point can be moved into unstable region 204 when an enable signal is provided by the function generator. Conversely, the operating point can be moved out of the unstable region and into one of the stable regions 206, 208 by the application of a disable signal. The resulting behavior of circuit 400 is that of a gated oscillator.

Figure 6:
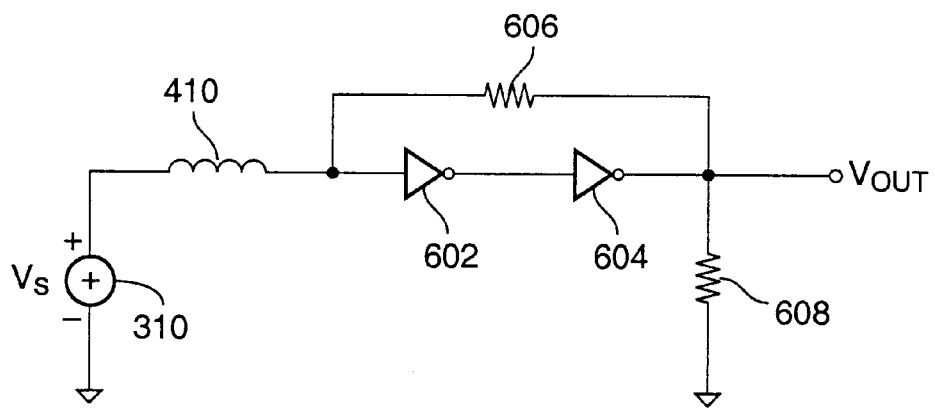
FIG. 6 is yet another example of a circuit configuration in accordance with the invention.

FIG. 6 shows yet another embodiment of the gated oscillator of the invention. As in the foregoing figures, a function generator 310 provide a variable voltage signal $V_s$. This signal feeds through inductor 410 into a first invertor 602. The output of inverter 602 is coupled to a second inverter 604. The output of inverter 604 is taken across resistor 608 to provide output $V_{out}$. A feedback path from the output of inverter 604 to the input of inverter 602 is provided via resistor 606.

Figure 7:
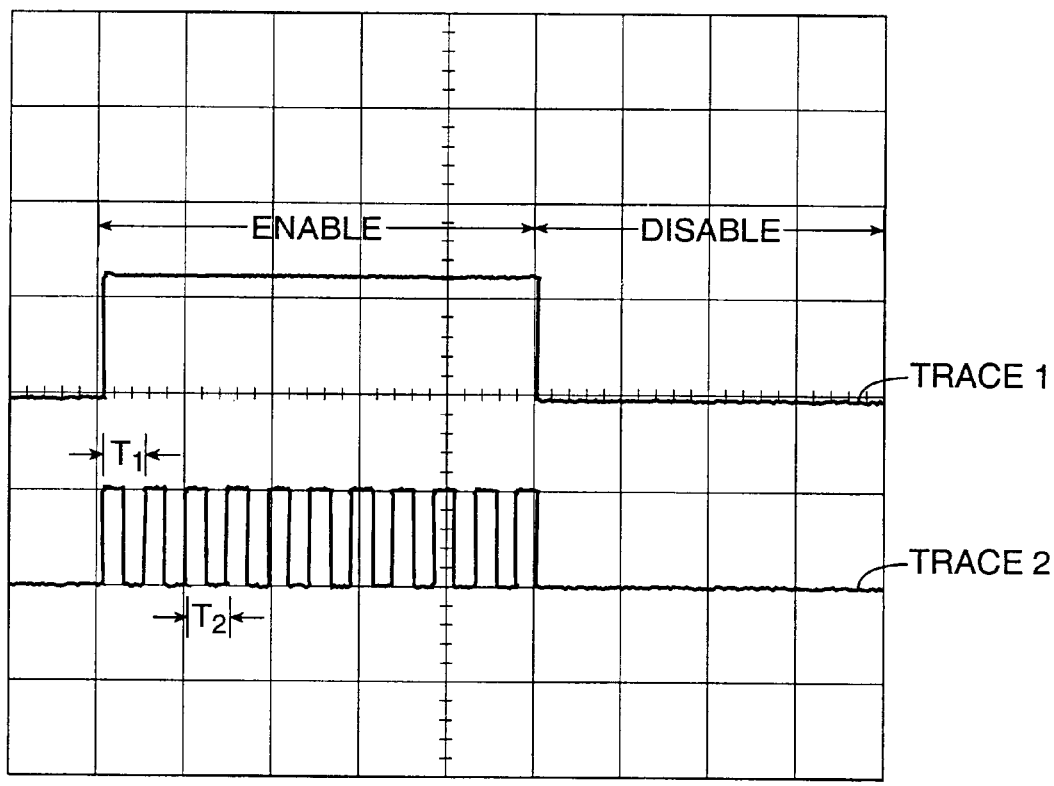
FIG. 7 illustrates measurements taken from a circuit constructed in accordance with the invention.

Referring now to FIG. 7, an oscilloscope trace is shown, illustrating the foregoing described behavior. Trace 1 is the output $V_s$ of function generator 310 as applied to the input of circuit 400. A first portion of the trace constitutes the ENABLE signal. This is followed by a second portion which constitutes the DISABLE signal. Preferably, the function generator output is a digital waveform. For example, a typical digital waveform is a square wave such as shown in FIG. 7. It is noted that typically, the digital waveform will be asymmetric along the time axis, since the periods of ON time and OFF time will depend on the nature of the particular application of the gated oscillator.

Trace 2 is the output voltage $V_{out}$ of circuit 400. As can be seen, the circuit begins to oscillate when an enable signal is received. The oscillations continue for the duration of the enable signal. It can be further seen that the first period $T_1$ of the first cycle has the same duration as each of the remaining cycles, $T_2$. The pulse width can be varied by changing the circuit parameters $R_f$, $R_1$, and $R_2$ or the op-amp DC bias $V_{CC}$. When the disable signal is received, the circuit stops oscillating instantaneously.

The location of the operating point along the transfer curve in the unstable region affects the period of oscillations of the output of circuit 400. The location of the operating point within the unstable region (and the stable regions for that matter) can be determined by adjusting the level of the forcing function. It can be seen, therefore, that different oscillation periods can be attained from circuit 400 by applying an enable signal of different levels. The gated oscillator of the invention can thus be made to produce different pulse widths by the use of a function generator in which the level of the enable signal can be controlled.

The invention described herein uses an unconventional method of controlling the operating point of a VdP oscillator to provide a significantly simplified digital circuit design which obviates the need for a clock circuit. The inventive circuit does not need additional supporting components. The invention obviates the need for a charging and a discharging capacitor for generating pulses. The invention dispenses with the support circuitry conventionally required to maintain capacitor potential when oscillation is stopped.

The invention requires only that an enabling signal be provided to "force" the VdP oscillator to oscillate and a disabling signal to stop oscillations. These signals can be readily generated by any of a number of known circuit designs.

The inventive gated oscillator circuit is advantageous in that its oscillations start and stop substantially instantaneously. Consequently, there are no transients between the ON and OFF state of the oscillator. Another advantage is that the period of the first cycle of oscillation during an ON period is the same as the subsequent cycles during that ON period.

Another advantage is that the circuit does not require any external free running oscillator. The circuit will generate its own oscillations when triggered by an enable signal. Consequently, this allows for significant reductions in power consumption in digital circuit applications. This is especially advantageous given the low power requirements of many of today's digital applications.

Yet another advantage, the circuit is inherently synchronized with the enable signal. By tuning the circuit parameter, without changing the circuit configuration, the duty cycle and the frequency of oscillation can be varied. The gated oscillation at the output of the circuit does not overlap with the enable signal and therefore no additional circuitry is required to separate the signals, thus realizing a simplification in the gated oscillator circuitry.

What is claimed is:

1. A method for providing pulses in a digital circuit comprising steps of:

providing a digital circuit;

providing a clocking circuit, said clocking circuit coupled to said digital circuit, said clocking circuit having an input terminal and an output terminal, said clocking circuit further having a variable operating point, said clocking circuit further having a transfer function characterized by having an unstable operating region bounded by a first stable operating region and a second stable operating region so that said clocking circuit produces oscillatory output when said operating point is varied into said unstable region and said clocking circuit has a non-oscillatory output when said operating point is varied into either of said first and second stable regions;

actively forcing said operating point into said unstable region to initiate operation of said clocking circuit to produce at least one oscillation; and actively forcing said operating point to vary into either one of said stable operating regions in order to terminate said at least one oscillation without transient effects, wherein said clocking circuit includes an element having negative impedance, said clocking circuit having a series input through an inductor, wherein said unstable operating region is a negative impedance region, and wherein said operating point is forced into said unstable region by a changing current applied through said inductor.

2. The method according to claim 1 wherein each said step of forcing includes applying a forcing function to said input of said clocking circuit, said forcing function having a first output level and a second output level, said clocking circuit characterized in that said operating point is located in said unstable region when said forcing function produces said first output level, said clocking circuit further characterized in that said operating point is located in one of said stable regions when said forcing function produces said second output level.

3. A method for providing pulses in a digital circuit comprising steps of:

providing a digital circuit;

providing a clocking circuit, said clocking circuit coupled to said digital circuit, said clocking circuit having an input terminal and an output terminal, said clocking circuit further having a variable operating point, said clocking circuit further having a transfer function characterized by having an unstable operating region bounded by a first stable operating region and a second stable operating region so that said clocking circuit produces oscillatory output when said operating point is varied into said unstable region and said clocking circuit has a non-oscillatory output when said operating point is varied into either of said first and second stable regions;

actively forcing said operating point into said unstable region to initiate operation of said clocking circuit to produce at least one oscillation; and actively forcing said operating point to vary into either one of said stable operating regions in order to terminate said at least one oscillation without transient effects, wherein each said step of forcing includes applying a forcing function to said input of said clocking circuit, said forcing function having a first output level and a second output level, said clocking circuit characterized in that said operating point is located in said unstable region when said forcing function produces said first output level, said clocking circuit further characterized in that said operating point is located in one of said stable regions when said forcing function produces said second output level, and wherein said forcing function produces a third output level, said circuit characterized in that said operating point is located in a part of said unstable region, when said forcing function produces said third output level, that is different from the location of said operating point when said forcing function produces said first output level.

4. A method for providing pulses in a digital circuit comprising steps of:

providing a digital circuit;

providing a clocking circuit, said clocking circuit coupled to said digital circuit, said clocking circuit having an input terminal and an output terminal, said clocking circuit further having a variable operating point, said clocking circuit further having a transfer function characterized by having an unstable operating region bounded by a first stable operating region and a second stable operating region so that said clocking circuit produces oscillatory output when said operating point is varied into said unstable region and said clocking circuit has a non-oscillatory output when said operating point is varied into either of said first and second stable regions;

actively forcing said operating point into said unstable region to initiate operation of said clocking circuit to produce at least one oscillation; and actively forcing said operating point to vary into either one of said stable operating regions in order to terminate said at least one oscillation without transient effects, wherein said clocking circuit includes an element having negative impedance, said clocking circuit having a series input through an inductor, wherein said unstable operating region is a negative impedance region, and wherein said operating point is forced into said unstable region by a changing current applied through said inductor, wherein said forcing function is asymmetrical along a time axis.

5. A method for providing pulses in a digital circuit comprising steps of:

providing a digital circuit;

providing a clocking circuit, said clocking circuit coupled to said digital circuit, said clocking circuit having an input terminal and an output terminal, said clocking circuit further having a variable operating point, said clocking circuit further having a transfer function characterized by having an unstable operating region bounded by a first stable operating region and a second stable operating region so that said clocking circuit produces oscillatory output when said operating point is varied into said unstable region and said clocking circuit has a non-oscillatory output when said operating point is varied into either of said first and second stable regions;

actively forcing said operating point into said unstable region to initiate operation of said clocking circuit to produce at least one oscillation; and actively forcing said operating point to vary into either one of said stable operating regions in order to terminate said at least one oscillation without transient effects, wherein said clocking circuit includes an element having negative impedance, said clocking circuit having a series input through an inductor, wherein said unstable operating region is a negative impedance region, and wherein said operating point is forced into said unstable region by a changing current applied through said inductor, wherein said forcing function is cyclical.

6. A method for providing pulses in a digital circuit comprising steps of:

providing a digital circuit;

providing a clocking circuit, said clocking circuit coupled to said digital circuit, said clocking circuit having an input terminal and an output terminal, said clocking circuit further having a variable operating point, said clocking circuit further having a transfer function characterized by having an unstable operating region bounded by a first stable operating region and a second stable operating region so that said clocking circuit produces oscillatory output when said operating point is varied into said unstable region and said clocking circuit has a non-oscillatory output when said operating point is varied into either of said first and second stable regions;

actively forcing said operating point into said unstable region to initiate operation of said clocking circuit to produce at least one oscillation; and actively forcing said operating point to vary into either one of said stable operating regions in order to terminate said at least one oscillation without transient effects, wherein said clocking circuit includes an element having negative impedance, said clocking circuit having a series input through an inductor, wherein said unstable operating region is a negative impedance region, and wherein said operating point is forced into said unstable region by a changing current applied through said inductor, wherein said forcing function is a square wave.

7. A method for providing pulses in a digital circuit comprising steps of:

providing a digital circuit;

providing a clocking circuit, said clocking circuit coupled to said digital circuit, said clocking circuit having an input terminal and an output terminal, said clocking circuit further having a variable operating point, said clocking circuit further having a transfer function characterized by having an unstable operating region bounded by a first stable operating region and a second stable operating region so that said clocking circuit produces oscillatory output when said operating point is varied into said unstable region and said clocking circuit has a non-oscillatory output when said operating point is varied into either of said first and second stable regions;

actively forcing said operating point into said unstable region to initiate operation of said circuit to produce at least one oscillation; and actively forcing said operating point to vary into either one of said stable operating regions in order to terminate said at least one oscillation without transient effects, wherein said clocking circuit includes an operational amplifier circuit with feedback, said circuit having a series input through an inductor, wherein said unstable operating region is a negative resistance region, and wherein said operating point is forced into said unstable region by a changing voltage applied to said inductor.

8. The method according to claim 1 wherein said element is a tunnel diode.

9. In a digital circuit, a clocking circuit, comprising:

a circuit having an input and an output, said circuit having a transfer function, said transfer function having an unstable operating region bounded by a first stable operating region and by a second stable operating region, said transfer function defining a set of operating points of said clocking circuit, said circuit adapted to produce oscillatory output when said operating point is varied into said unstable region, said circuit further adapted to produce a non-oscillatory output when said operating point is varied into either of said first and second stable regions; and a function generator having an output adapted to selectively produce an output of a first level and an output of a second level, said function generator output coupled to said input, said operating point is actively forced into said unstable region when said function generator output is at said first level, said clocking circuit further adapted so that said operating point is actively forced to said stable region when said function generator output is at said second level, wherein said clocking circuit includes an element having negative impedance, said clocking circuit having an inductor serially connected to said input, wherein said unstable operating region is a negative impedance region, and wherein said operating point is forced into said unstable region by a changing current applied through said inductor.

10. In a digital circuit, a clocking circuit, comprising:

a circuit having an input and an output, said circuit having a transfer function, said transfer function having an unstable operating region bounded by a first stable operating region and by a second stable operating region, said transfer function defining a set of operating points of said circuit, said circuit adapted to produce oscillatory output when said operating point is varied into said unstable region, said circuit further adapted to produce a non-oscillatory output when said operating point is varied into either of said first and second stable regions; and a function generator having an output adapted to selectively produce an output of a first level and an output of a second level, said function generator output coupled to said circuit input, said operating point is forced into said unstable region when said function generator output is at said first level, said circuit further adapted so that said operating point is forced to said stable region when said function generator output is at said second level, wherein said function generator produces an output of a third level; said operating point is forced into said unstable region when said function generator output is at said third level; said operating point being located in said unstable region based on whether said function generator output is at said first level or said third level.

11. In a digital circuit, a clocking circuit, comprising:

a circuit having an input and an output, said circuit having a transfer function, said transfer function having an unstable operating region bounded by a first stable operating region and by a second stable operating region, said transfer function defining a set of operating points of said circuit, said circuit adapted to produce oscillatory output when said operating point is varied into said unstable region, said circuit further adapted to produce a non-oscillatory output when said operating point is varied into either of said first and second stable regions; and a function generator having an output adapted to selectively produce an output of a first level and an output of a second level, said function generator output coupled to said input, said circuit including an element having negative impedance, said circuit having an inductor serially connected to said input, wherein said unstable operating region is a negative impedance region, and wherein said operating point is forced into said unstable region by a changing current applied through said inductor, said operating point is forced into said unstable region when said function generator output is at said first level, said circuit further adapted so that said operating point is forced to said stable region when said function generator output is at said second level, wherein said function generator produces a cyclical output.

12. In a digital circuit, a clocking circuit, comprising:

a circuit having an input and an output, said circuit having a transfer function, said transfer function having an unstable operating region bounded by a first stable operating region and by a second stable operating region, said transfer function defining a set of operating points of said circuit, said circuit adapted to produce oscillatory output when said operating point is varied into said unstable region, said circuit further adapted to produce a non-oscillatory output when said operating point is varied into either of said first and second stable regions; and a function generator having an output adapted to selectively produce an output of a first level and an output of a second level, said function generator output coupled to said input, said circuit including an element having negative impedance, said circuit having an inductor serially connected to said input, wherein said unstable operating region is a negative impedance region, and wherein said operating point is forced into said unstable region by a changing current applied through said inductor, said operating point is forced into said unstable region when said function generator output is at said first level, said circuit further adapted so that said operating point is forced to said stable region when said function generator output is at said second level, wherein said function generator output produces a square wave.

13. In a digital circuit, a clocking circuit, comprising:

a circuit having an input and an output, said circuit having a transfer function, said transfer function having an unstable operating region bounded by a first stable operating region and by a second stable operating region, said transfer function defining a set of operating points of said circuit, said circuit adapted to produce oscillatory output when said operating point is varied into said unstable region, said circuit further adapted to produce a non-oscillatory output when said operating point is varied into either of said first and second stable regions; and a function generator having an output adapted to selectively produce an output of a first level and an output of a second level, said function generator output coupled to said input, said circuit including an element having negative impedance, said circuit having an inductor serially connected to said input, wherein said unstable operating region is a negative impedance region, and wherein said operating point is forced into said unstable region by a changing current applied through said inductor, said operating point is forced into said unstable region when said function generator output is at said first level, said circuit further adapted so that said operating point is forced to said stable region when said function generator output is at said second level, wherein said function generator output has an asymmetrical shape.

14. The digital circuit of claim 9 wherein said element is a tunnel diode.

15. A method for providing clocking pulses, comprising:

providing a circuit having an input terminal and an output terminal, said circuit further having a variable operating point, said circuit further having a transfer function characterized by having an unstable operating region bounded by a first stable operating region and a second stable operating region so that said circuit produces oscillatory output when said operating point is varied into said unstable region and said circuit has a non-oscillatory output when said operating point is varied into either of said first and second stable regions;

actively forcing said operating point into said unstable region to initiate operation of said circuit to produce at least one oscillation; and actively forcing said operating point to vary into either one of said stable operating regions in order to terminate said at least one oscillation without transient effects, wherein said circuit includes an element having negative impedance, said circuit having an inductor serially connected to said input terminal, wherein said unstable operating region is a negative impedance region, and wherein said operating point is forced into said unstable region by a changing current applied through said inductor.

16. The method according to claim 15 wherein each said step of forcing includes applying a forcing function to said input of said circuit, said forcing function having a first output level and a second output level, said circuit characterized in that said operating point is located in said unstable region when said forcing function produces said first output level, said circuit further characterized in that said operating point is located in one of said stable regions when said forcing function produces said second output level.

17. A method for providing clocking pulses, comprising:

providing a circuit having an input terminal and an output terminal, said circuit further having a variable operating point, said circuit further having a transfer function characterized by having an unstable operating region bounded by a first stable operating region and a second stable operating region so that said circuit produces oscillatory output when said operating point is varied into said unstable region and said circuit has a non-oscillatory output when said operating point is varied into either of said first and second stable regions;

forcing said operating point into said unstable region to initiate operation of said circuit to produce at least one oscillation; and forcing said operating point to vary into either one of said stable operating regions in order to terminate said at least one oscillation without transient effects, wherein each said step of forcing includes applying a forcing function to said input of said circuit, said forcing function having a first output level and a second output level, said circuit characterized in that said operating point is located in said unstable region when said forcing function produces said first output level, said circuit further characterized in that said operating point is located in one of said stable regions when said forcing function produces said second output level, wherein said forcing function produces a third output level, said circuit characterized in that said operating point is located in a part of said unstable region, when said forcing function produces said third output level, that is different from the location of said operating point when said forcing function produces said first output level.

18. A method for providing clocking pulses, comprising:

providing a circuit having an input terminal and an output terminal, said circuit further having a variable operating point, said circuit further having a transfer function characterized by having an unstable operating region bounded by a first stable operating region and a second stable operating region so that said circuit produces oscillatory output when said operating point is varied into said unstable region and said circuit has a non-oscillatory output when said operating point is varied into either of said first and second stable regions;

forcing said operating point into said unstable region to initiate operation of said circuit to produce at least one oscillation; and forcing said operating point to vary into either one of said stable operating regions in order to terminate said at least one oscillation without transient effects, wherein said circuit includes an operational amplifier circuit with feedback, said circuit having a series input through an inductor, wherein said unstable operating region is a negative resistance region, and wherein said operating point is forced into said unstable region by a changing voltage applied to said inductor.

19. A gated oscillator circuit, comprising:

a circuit having an input and an output, said circuit having a transfer function, said transfer function having an unstable operating region bounded by a first stable operating region and by a second stable operating region, said transfer function defining a set of operating points of said circuit, said circuit adapted to produce oscillatory output when said operating point is varied into said unstable region, said circuit further adapted to produce a non-oscillatory output when said operating point is varied into either of said first and second stable regions; and a function generator having an output adapted to selectively produce an output of a first level and an output of a second level, said function generator output coupled to said input, wherein said circuit includes an element having negative impedance, said circuit having an inductor serially connected to said input, wherein said unstable operating region is a negative impedance region, and wherein said operating point is forced into said unstable region by a changing current applied through said inductor, said operating point is actively forced into said unstable region when said function generator output is at said first level, said circuit further adapted so that said operating point is actively forced to said stable region when said function generator output is at said second level.

20. A gated oscillator circuit, comprising:

a circuit having an input and an output, said circuit having a transfer function, said transfer function having an unstable operating region bounded by a first stable operating region and by a second stable operating region, said transfer function defining a set of operating points of said circuit, said circuit adapted to produce oscillatory output when said operating point is varied into said unstable region, said circuit further adapted to produce a non-oscillatory output when said operating point is varied into either of said first and second stable regions; and a function generator having an output adapted to selectively produce an output of a first level and an output of a second level, said function generator output coupled to said input, wherein said circuit includes an element having negative impedance, said circuit having an inductor serially connected to said input, wherein said unstable operating region is a negative impedance region, and wherein said operating point is forced into said unstable region by a changing current applied through said inductor, said operating point is forced into said unstable region when said function generator output is at said first level, said circuit further adapted so that said operating point is forced to said stable region when said function generator output is at said second level, wherein said function generator produces an output of a third level, said operating point is forced into said unstable region when said function generator output is at said third level, said operating point being located in said unstable region based on whether said function generator output is at said first level or said third level.

* * * * *